United States Patent
Cornwell, Jr. et al.

(10) Patent No.: US 6,785,103 B2
(45) Date of Patent: Aug. 31, 2004

(54) MAGNETORESISTANCE SENSOR WITH REDUCED SIDE READING

(75) Inventors: Dwight Cornwell, Jr., Prunedale, CA (US); Hardayal Singh Gill, Palo Alto, CA (US); Mustafa Pinarbasi, Morgan Hill, CA (US)

(73) Assignee: International Business Machines Corporation, Armonk, NY (US)

(*) Notice: Subject to any disclaimer, the term of this patent is extended or adjusted under 35 U.S.C. 154(b) by 167 days.

(21) Appl. No.: 10/121,493

(22) Filed: Apr. 12, 2002

(65) Prior Publication Data

US 2003/0193761 A1 Oct. 16, 2003

(51) Int. Cl.⁷ ................................................. G11B 5/39
(52) U.S. Cl. ................................................. 360/324.12
(58) Field of Search .................................... 360/324.12

(56) References Cited

U.S. PATENT DOCUMENTS

| | | | |
|---|---|---|---|
| 5,739,987 A | 4/1998 | Yuan et al. | |
| 6,118,624 A | 9/2000 | Fukuzawa et al. | |
| 6,141,191 A | 10/2000 | Lee et al. | |
| 6,469,877 B1 * | 10/2002 | Knapp et al. | 360/324.12 |
| 6,570,745 B1 * | 5/2003 | Gill | 360/324.12 |

* cited by examiner

Primary Examiner—A. J. Heinz
(74) Attorney, Agent, or Firm—Gregory Garmong; William D. Gill

(57) ABSTRACT

A magnetoresistance sensor includes a substrate and a sensor structure deposited upon the substrate and having a first lateral side and a second lateral side. The sensor structure includes a layered transverse biasing structure, a free layer deposited upon the layered transverse biasing structure, and a cap layer deposited upon a central portion of the free layer but not upon a side portion of the free layer adjacent to each lateral side. Longitudinal hard biasing structures are disposed laterally adjacent to the lateral sides of the sensor structure. Each longitudinal hard biasing structure has a magnetic seed layer deposited upon the substrate, the respective lateral side of the sensor structure, and the respective side portion of the free layer. A magnetic hard bias layer is deposited upon the seed layer.

11 Claims, 3 Drawing Sheets

MAGNETORESISTANCE SENSOR WITH REDUCED SIDE READING

This invention relates to a thin-film magnetoresistance sensor and, more particularly, to such a sensor having reduced side reading and improved magnetic stability.

BACKGROUND OF THE INVENTION

A magnetoresistance (MR) sensor is used in a read/write head to read magnetic fields on a recording medium of a magnetic storage device. An example is the read/write head of a computer hard disk or a magnetic recording tape drive. The read/write head of the computer hard disk is positioned closely adjacent to the recording medium, separated from the recording medium by an air bearing that does not allow them to touch. A data bit is written onto an area, usually a track, of the recording medium using the writing portion of the read/write head by locally changing its magnetic state. That magnetic state is later sensed by the MR sensor to read the data bit.

Two known types of MR sensors are a giant magnetoresistance (GMR) sensor and a tunnel magnetoresistance (TMR) sensor. In general, the sensors are multilayered thin-film devices that sense the magnetic state of the adjacent region of the recording medium. The general technical basis, construction, and operation of the GMR sensor are described, for example, in U.S. Pat. No. 5,436,778. The general technical basis, construction, and operation of the TMR sensor are described, for example, in U.S. Pat. No. 5,729,410. The disclosures of both patents are incorporated by reference in their entireties. These patents also describe the read/write heads and the magnetic storage systems.

There is an ongoing trend to increase the amount of information stored on the magnetic storage device. The amount of information stored may be increased by decreasing the size and spacing of the data tracks of the recording medium in which the information is stored on the magnetic storage device. The size of the MR sensor must be correspondingly decreased and its spatial resolution increased.

Problems arise as the MR sensor is made smaller. One problem is "side reading", where the MR sensor detects the magnetic state of the track of the recording medium directly below the MR sensor, as intended, but also detects some signal from the laterally adjacent tracks. The side reading signal may result in an erroneous reading of the track that is intended to be read. Another problem is that the magnetic stability of the MR sensor may be reduced as the sensor is made smaller.

There is a need for modifications to the design of the MR sensor to reduce the incidence of side reading and magnetic instability. The present invention fulfills this need, and further provides related advantages.

SUMMARY OF THE INVENTION

The present invention provides a magnetoresistance (MR) sensor and a method for its fabrication. A side portion of the free layer of the MR sensor is pinned so that it cannot contribute to side reading and to magnetic destabilization. In one approach, the MR sensor has a longitudinal hard biasing structure that exchange couples to the free layer of the MR sensor to pin the free layer. As a result, the side portions of the free layer adjacent to the lateral sides of the MR sensor do not contribute to side reading or magnetic instability of the MR sensor. The present approach may be readily implemented by available fabrication techniques previously used for other purposes. It is applicable to both giant magnetoresistance (GMR) sensors and tunnel magnetoresistance (TMR) sensors.

In accordance with the invention, a magnetoresistance (MR) sensor, such as a giant magnetoresistance (GMR) sensor or a tunnel magnetoresistance (TMR) sensor, comprises a substrate and a sensor structure contacting and deposited upon the substrate, and having a lateral side. The sensor structure comprises a layered transverse biasing structure, and a free layer contacting the layered transverse biasing structure. The free layer has a central portion that is magnetically free to respond to an external magnetic field, and a side portion extending toward the central portion from the lateral side and which is magnetically pinned so that it is not free to respond to the external magnetic field. Optionally, a cap layer overlies at least a portion of the free layer.

A longitudinal hard biasing structure contacts at least the lateral side of the sensor structure. The side portion of the free layer is preferably pinned by exchange coupling from the longitudinal hard biasing structure. The longitudinal hard biasing structure desirably comprises a seed layer contacting the substrate, the lateral side of the sensor structure, and the side portion of the free layer. The seed layer has a seed layer crystal structure, which is preferably body centered cubic (BCC), and is a magnetic material. The longitudinal hard biasing structure further includes a magnetic hard bias layer contacting the seed layer. The hard bias layer has a hard bias layer crystal structure which is preferably hexagonal close packed (HCP) with the Z-axis in the plane of the film. Most preferably, the seed layer is a BCC CoFeCr alloy, and the hard bias layer is an HCP CoPtCr alloy. There is additionally an external interconnection to the sensor structure.

In one embodiment, the magnetoresistance sensor comprises a substrate, and a sensor structure deposited upon the substrate and having a first lateral side and a second lateral side. The sensor structure comprises a layered transverse biasing structure, a free layer deposited upon the layered transverse biasing structure, and optionally a cap layer deposited upon a central portion of the free layer but not upon a side portion of the free layer adjacent to each lateral side thereof. A first longitudinal hard biasing structure is laterally adjacent to the first lateral side of the sensor structure, and a second longitudinal hard biasing structure is laterally adjacent to the second lateral side of the sensor structure. Each longitudinal hard biasing structure comprises a seed layer deposited upon the substrate, the respective lateral side of the sensor structure, and the respective side portion of the free layer. The seed layer has a seed layer crystal structure, which is preferably body centered cubic, and is a magnetic material. The longitudinal hard biasing structure also includes a magnetic hard bias layer deposited upon the seed layer. The hard bias layer has a hard bias layer crystal structure which is preferably hexagonal close packed. Features discussed for other embodiments may be used in conjunction with this embodiment, where appropriate.

A method of fabricating a magnetoresistance sensor comprises the steps of providing a substrate, and depositing a sensor structure upon the substrate. The sensor structure has a lateral side and comprises a layered transverse biasing structure, and a free layer in contact with the layered transverse biasing structure. The free layer has a central portion and a side portion adjacent to the lateral side. A longitudinal hard biasing structure is deposited contacting the sensor structure by the step of depositing a magnetic hard bias layer overlying the lateral side of the sensor structure and the side portion of the free layer but not the central portion of the free layer. Preferably, a magnetic seed layer is first deposited upon the substrate, the lateral side of the sensor structure, and the side portion of the free layer, and then depositing the magnetic hard bias layer upon the seed layer. The seed layer has a seed layer crystal structure that is preferably body centered cubic, and the longitudinal hard bias layer has a hard bias layer crystal structure which is preferably hexagonal close packed.

In a conventional MR sensor, the greatest contribution to side reading and magnetic instability arises from the magnetic response of the portion of the free layer that is adjacent to the lateral sides of the MR sensor. The present approach inhibits the side portion from responding to magnetic fields other than those positioned directly below the central portion of the free layer. It also inhibits the formation of domain walls near the sides of the free layer, which when present contribute to magnetic instability.

The side portion of the free layer desirably has a width exceeding about 0.05 micrometers. If the width is less than this value, there may be insufficient exchange coupling to the face of the free layer to pin the side portion. This width is determined in the fabrication processing.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

DETAILED DESCRIPTION OF THE INVENTION

Figure 1:
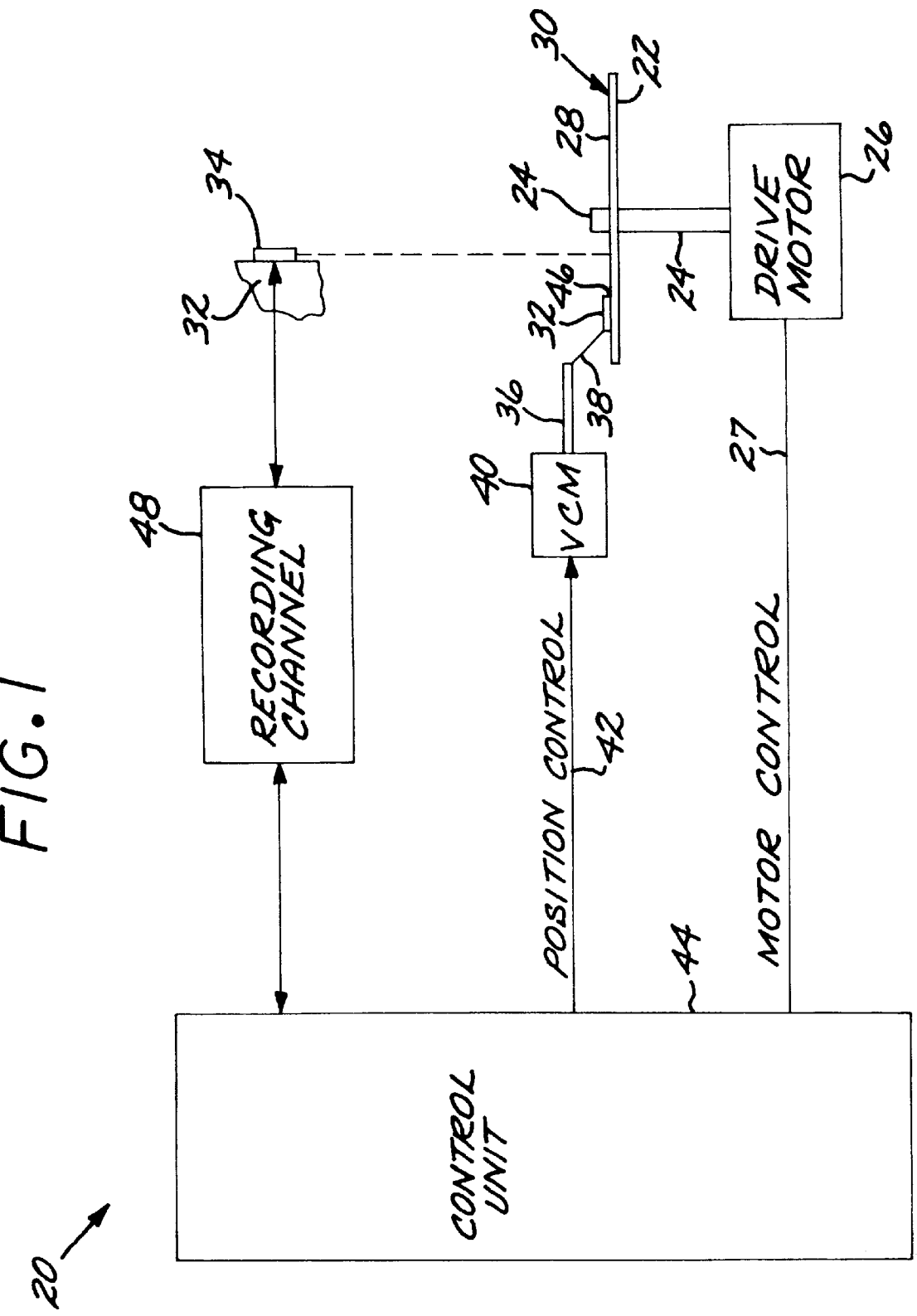
FIG. 1 is a schematic diagram of a magnetic disk data storage system.

FIG. 1 shows a data storage system, here depicted as a magnetic disk drive system 20, with which the present approach may be used. The magnetic disk drive system 20 includes a rotatable magnetic storage disk 22 that is supported on a spindle 24 and rotated by a disk drive motor 26 under motor control 27 of a control unit 44. A magnetic storage medium 28 is deposited on a surface 30 of the magnetic storage disk 22.

A slider 32 is positioned in facing relation to the magnetic storage disk 22. The slider 32 supports at least one read/write head 34 in facing relation to the magnetic storage medium 28 present on the facing surface of the magnetic storage disk 22. The slider 32 is mounted to an actuator arm 36 by a suspension 38. The actuator arm 36 and the slider 32 move radially inwardly and outwardly relative to the magnetic storage disk 22 so that the combined inward/outward motion of the slider 32 and the rotation of the magnetic storage disk 22 allow the read/write head 34 to be placed into facing relation to any region over the entire area of the magnetic storage medium 28. The actuator arm 36 is driven by an actuator 40 (depicted as a voice coil motor or VCM) under the radial position control 42 of the control unit 44.

The suspension 38 generates a slight spring force which biases the slider 32 toward the surface 30 of the magnetic storage disk 22. During sensor operation the magnetic storage disk 22 turns, and an air bearing is created between the downwardly facing surface of the slider 32, termed the air bearing surface 46 or ABS, and the upwardly facing surface 30 of the magnetic storage disk 22. (Only the downwardly oriented slider is illustrated, but there may also or instead be an upwardly oriented slider facing the bottom side of the magnetic storage disk.) The air bearing counterbalances the slight spring force of the suspension 38 and supports the slider 32 a small distance above the surface 30 with a small, substantially constant separation.

The read/write head 34 writes data onto the magnetic storage medium 28 by altering magnetic states in the magnetic storage medium, and also reads data from the magnetic storage medium 28 by sensing the magnetic states in the magnetic storage medium 28. The writing and reading commands, as well as the data to be written or read, are transmitted between the control unit 44 and the read/write head 34 over a recording channel 48, which provides the external interconnection to the sensor structure of the read portion of the read/write head 34. The present approach is concerned with the magnetoresistance (MR) sensor that is part of the read/write head 34.

The preceding discussion is a simplified description of the data storage system in the form of the magnetic disk drive system 20, to set the environment in which the present invention is used. The present invention is also applicable to other types of magnetic data storage systems such as magnetic tape drives and their read/write heads.

Figure 2:
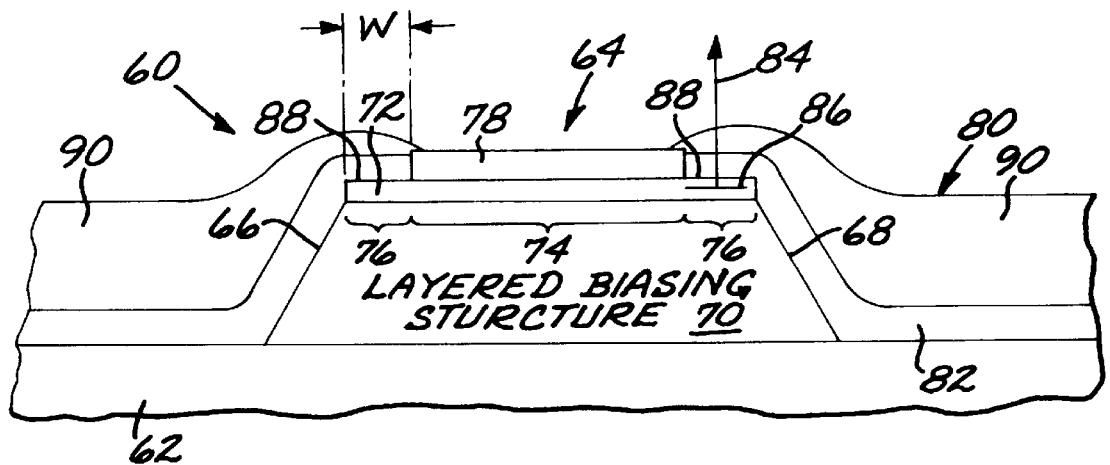
FIG. 2 is a schematic elevational view of the magnetoresistance sensor.
Figure 3:
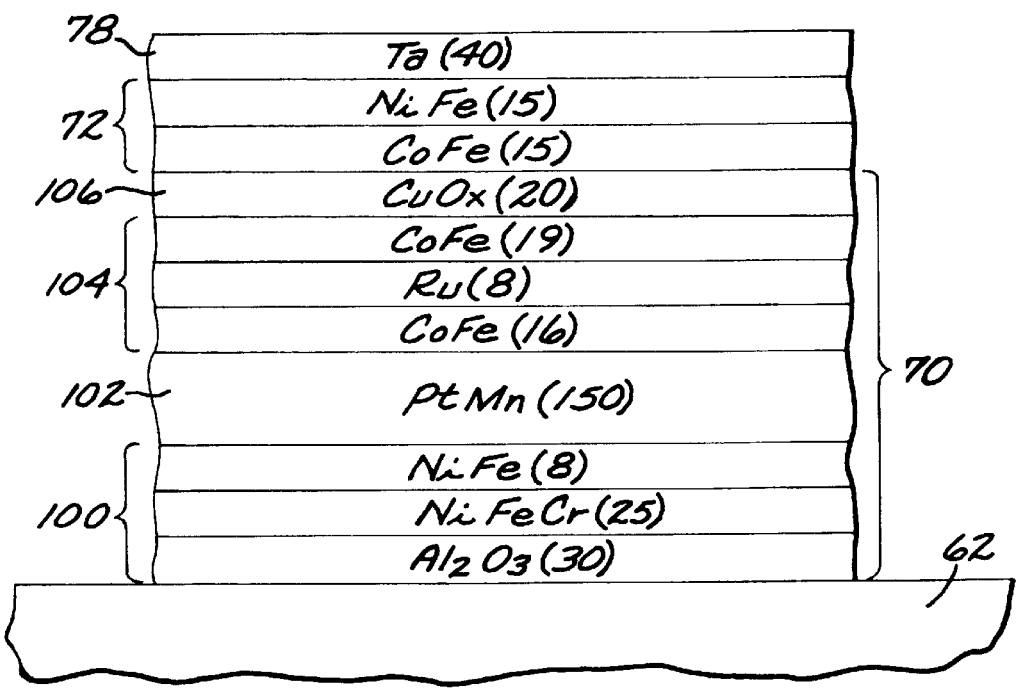
FIG. 3 is a schematic elevational view of one form of the layered structure.

The present invention is concerned with the sensing portion of the read/write head 34 and specifically a magnetoresistance sensor that is part of the read/write head 34. A magnetoresistance (MR) sensor 60 is illustrated in FIG. 2. (FIGS. 2–3 are not drawn to scale.) The magnetoresistance sensor 60 comprises a substrate 62 and a sensor structure 64, having lateral sides 66 and 68, that is deposited upon the substrate 62. The sensor structure 64 comprises a layered transverse (i.e., perpendicular to the air bearing surface 46) biasing structure 70. In the illustrated embodiment, the layered transverse biasing structure 70 is deposited upon and contacts the substrate 62, but it may be positioned at other locations in the sensor.

A free layer 72 contacts the layered transverse biasing structure 70. The free layer 72 has a central portion 74 that is magnetically free to respond to an external magnetic field from a source (not shown) that is vertically in registry and aligned with the central portion (and above it in FIG. 2), and a side portion 76 extending inwardly toward the central portion 74 from the lateral sides 66 and 68. The side portion 76 is magnetically pinned so that it is not free to respond to the external magnetic field. A cap layer 78 preferably overlies at least a portion of the free layer 72. In the preferred embodiment the cap layer 78 overlies the central portion 74 but not the side portions 76 of the free layer 72.

A longitudinal (i.e., parallel to the air bearing surface 46) hard biasing structure 80 contacts at least the lateral sides 66 and 68 of the sensor structure 64. In the preferred embodiment, each side portion 76 of the free layer 72 is pinned by exchange coupling from the longitudinal hard biasing structure 80. To accomplish this pinning as well as the biasing function of the longitudinal hard biasing structure, the longitudinal hard biasing structure 80 preferably includes a seed layer 82 that contacts the substrate 62, the lateral sides 66 and 68 of the sensor structure 64, and the side portion 76 (but not the central portion 74) of the free layer 72. The free layer 72 and its side portion 76 comprise a thin planar film having a normal direction 84 that is perpendicular to a plane 86 of the free layer 72 and the side portion 76. Each side portion 76 has a side-portion surface 88 that lies perpendicular to the normal direction 84. The seed layer 82 contacts this side-portion surface 88. The side portion 76 of the free layer 72 desirably has a width W exceeding about 0.05 micrometers, where the width W is measured along the side portion surface 88 between the lateral side 66 or 68 and the closest portion of the cap layer 78. If W is less than about 0.05 micrometers, there may be insufficient exchange coupling to the face of the free layer to pin the side portion 76, and the fabrication of the side portion 76 may not be possible using available techniques.

The seed layer 82 has a seed layer crystal structure that is preferably a body centered cubic (BCC) crystal structure. The seed layer 82 is a ferromagnetic material. The seed layer 82 is preferably a BCC CoFeCr alloy such as $[CoFe]_{0.85}Cr_{0.15}$ (by weight). The seed layer 82 is preferably about 30 Angstroms thick.

The longitudinal hard biasing structure 80 further includes a magnetic hard bias layer 90 that overlies and contacts the seed layer 82. The magnetic longitudinal hard bias layer 90 has a hard bias layer crystal structure which is preferably hexagonal close packed (HCP) with the Z-direction lying parallel to the plane 86. The magnetic hard bias layer 90 is preferably an HCP CoPtCr alloy such as $Co_{0.80}Pt_{0.12}Cr_{0.08}$ (by weight). The magnetic hard bias layer 90 may contact the cap layer 78 as illustrated. The thickness of the magnetic hard bias layer 90 is preferably about eight times the thickness of the free layer 72.

The direct physical contact of the seed layer 82 to the side-portion surface 88 of the side portion 76 of the free layer 72 magnetically pins the side portion 76 of the free layer 72 by exchange coupling to the longitudinal hard biasing structure 80. Since the side portion 76 is magnetically pinned, it cannot respond to laterally spaced magnetic sources and therefore cannot contribute to side reading.

In the conventional sensor, the magnetic field of the hard bias layer, for the portion of the free layer under the hard bias layer, is usually the reverse of the field at the free layer. This field reversal causes the formation of domain walls in the free layer 72 under the hard bias, in turn contributing to magnetic instability in the free layer 72. In the present approach, because of the exchange coupling between the seed layer 82 and the side portion 76 of the free layer 72, the formation of domain walls is inhibited. The result is that the free layer 72 is more magnetically stable in the present approach than in the absence of the exchange coupling.

Any operable layered transverse biasing structure 70, free layer 72, and cap layer 78 may be used in the MR sensor 60. FIG. 3 depicts a preferred form of the layered transverse biasing structure 70, the free layer 72, and the cap layer 78 that produces a GMR sensor, but other operable forms such as inverted order of the structures and a TMR sensor structure may be used as well. The designations of the layers in FIG. 3 are indicated, along with a preferred layer material of construction and a preferred thickness. Following a standard convention, the number in parentheses after each layer material is its preferred thickness in Angstroms.

Figure 4:
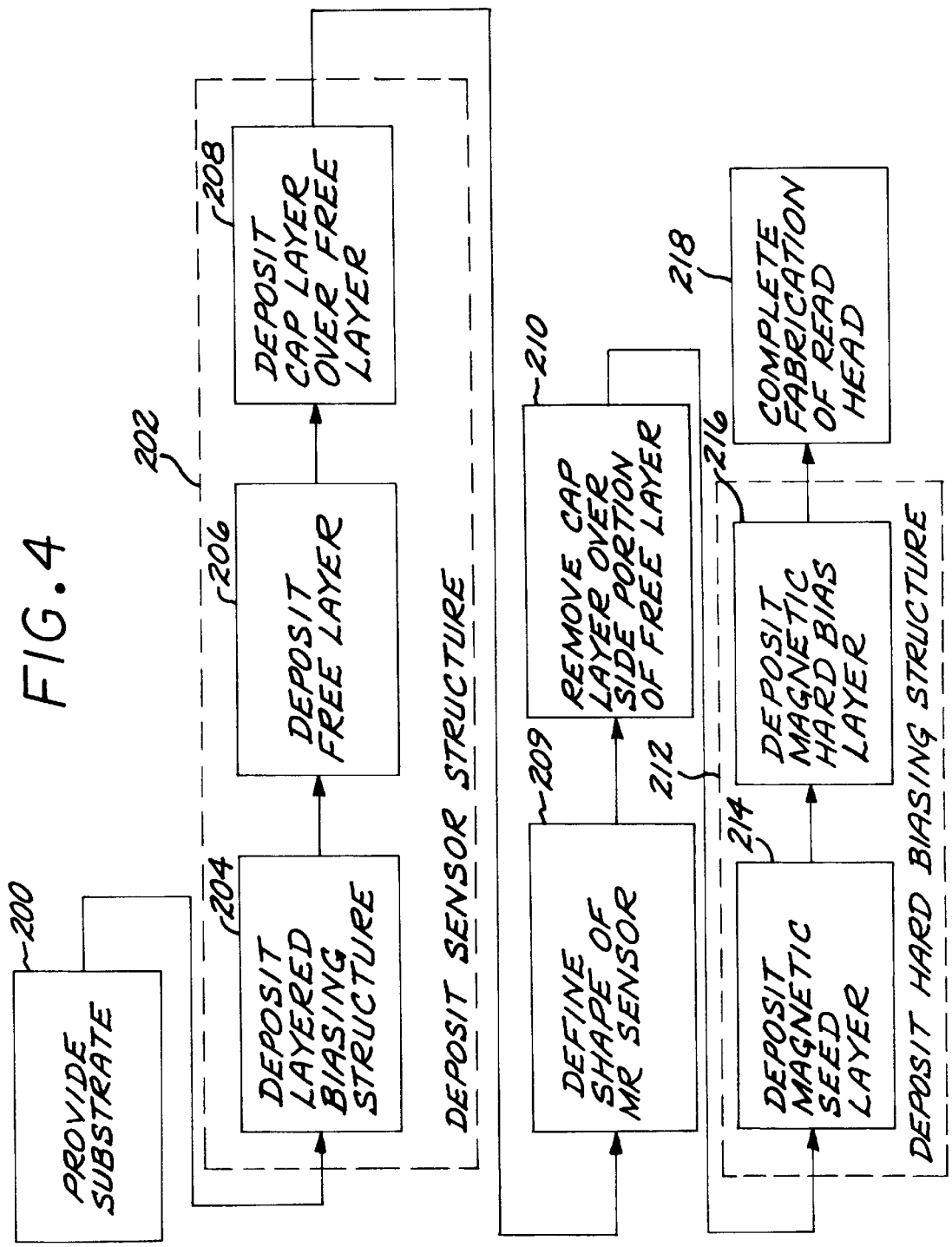
FIG. 4 is a block flow diagram of an approach for fabricating a magnetoresistance sensor.

Starting from the bottom in FIG. 3, the substrate 62 is preferably aluminum oxide ($Al_2O_3$). Deposited upon and contacting the substrate is a stack seed layer 100 (not to be confused with the seed layer 82 in the longitudinal hard biasing structure 80). The stack seed layer 100 has three sublayers: an $Al_2O_3$ sublayer about 30 Angstroms thick deposited upon and contacting the substrate 62, a NiFeCr sublayer about 25 Angstroms thick deposited upon and contacting the $Al_2O_3$ sublayer, and a NiFe sublayer about 8 Angstroms thick deposited upon and contacting the NiFeCr sublayer. A Pt—Mn transverse pinning layer 102 about 150 Angstroms thick is deposited upon and contacts the stack seed layer 100. A transverse pinned layer structure 104 is deposited upon and contacts the Pt—Mn transverse pinning layer 102. The transverse pinned layer structure 104 includes three sublayers, a Co—Fe sublayer about 16 Angstroms thick deposited upon and contacting the transverse pinning layer 102, a Ru sublayer about 8 Angstroms thick deposited upon and contacting the Co—Fe sublayer, and a Co—Fe sublayer about 19 Angstroms thick deposited upon and contacting the Ru sublayer. A $CuO_x$ spacer layer 106 about 20 Angstroms thick is deposited upon and contacts the transverse pinned layer structure 104 to complete the layered transverse biasing structure 70. The free layer 72 is deposited upon and contacts the spacer layer 106. In the illustrated form, the free layer 72 has two sublayers, a Co—Fe sublayer about 15 Angstroms thick deposited upon and contacting the spacer layer 106, and a NiFe sublayer about 15 Angstroms thick deposited upon and contacting the Co—Fe sublayer. The cap layer 78, preferably made of Ta about 40 Angstroms thick, is deposited upon and contacts the central portion 74 of the free layer 72 but not the side portion 76 of the free layer 72. The present approach is operable with other forms of the layered sensor structure 64, such as those used in other forms of GMR sensors and in TMR sensors FIG. 4 depicts in block diagram form a method of fabricating a magnetoresistance sensor. The substrate 62 is provided, numeral 200. The sensor structure 64 is deposited on the substrate 62, numeral 202. To fabricate the sensor structure shown in FIG. 3, the layered transverse biasing structure 70 is deposited upon the substrate 62, numeral 204, the free layer 72 is deposited upon the layered transverse biasing structure 70, numeral 206, and the cap layer 78 is deposited upon the free layer 72, numeral 208. The overall shape of the MR sensor and the lateral sides 66 and 68 are then defined, numeral 209, typically by ion milling. In the preferred approach, the cap layer 78 is deposited over the entire free layer 72 in step 208, and then a portion of the cap layer 78 is removed, numeral 210, to expose the side portion 76 of the free layer 72 adjacent to each of the lateral sides 66 and 68. The removal step 210 is preferably performed by reactive ion etching with the portions that are not to be removed covered with a suitable mask. The cap layer 78 remains over the central portion 74 of the free layer 72. Alternatively, the cap layer 78 could be deposited over just the central portion 74 of the free layer 72, and not the side portions 76, by a lithographic or mask technique.

The method further includes depositing the longitudinal hard biasing structure 80 contacting the sensor structure 64, numeral 212. This step 212 is accomplished by first depositing, numeral 214, the seed layer 82 upon the substrate 62, the lateral sides 66 and 68 of the sensor structure 64, and the side portion 76 of the free layer 72. The magnetic hard bias layer 90 is thereafter deposited, numeral 216, upon the seed layer 82. The fabrication of the read head is completed by conventional techniques, numeral 218.

In all of these method steps, the materials and thicknesses discussed above are utilized in the preferred embodiment, but alternative materials of construction and thicknesses may be used to the extent operable.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A magnetoresistance sensor comprising:
   a substrate;
   a sensor structure overlying the substrate and having a lateral side, the sensor structure comprising;
      a layered transverse biasing structure; and
      a free layer contacting the layered transverse biasing structure, the free layering having;
         a central portion that is magnetically free to respond to an external magnetic field; and
         a side portion extending toward the central portion from the lateral side and which is magnetically pinned so that it is not free to respond to the external magnetic field; and
   a longitudinal hard biasing structure contacting at least the lateral side of the sensor structure; and
   wherein the side portion of the free layer has a width exceeding about 0.05 micrometers.

2. A magnetoresistance sensor comprising:
   a substrate;
   a sensor structure overlying the substrate and having a lateral side, the sensor structure comprising;
      a layered transverse biasing structure; and
      a free layer contacting the layered transverse biasing structure, the free layering having;
         a central portion that is magnetically free to respond to an external magnetic field; and
         a side portion extending toward the central portion from the lateral side and which is magnetically pinned so that it is not free to respond to the external magnetic field; and
   a longitudinal hard biasing structure contacting at least the lateral side of the sensor structure, wherein the longitudinal hard biasing structure comprises a seed layer contacting the substrate, the lateral side of the sensor structure, and the side portion of the free layer, the seed layer having a seed layer crystal structure and being a magnetic material, and a magnetic hard bias layer contacting the seed layer, the hard bias layer having a hard bias layer crystal structure.

3. The magnetoresistance sensor of claim 2, wherein the seed layer crystal structure is body centered cubic, and the hard bias layer crystal structure is hexagonal close packed.

4. The magnetoresistance sensor of claim 2, wherein the sensor structure comprises a giant magnetoresistance sensor.

5. The magnetoresistance sensor of claim 2, wherein the sensor structure further includes a cap layer overlying at least a portion of the free layer.

6. A magnetoresistance sensor comprising:
   a substrate;
   a sensor structure deposited upon the substrate and having a first lateral side and a second lateral side, the sensor structure comprising
      a layered transverse biasing structure,
      a free layer contacting the layered transverse biasing structure, and
      a cap layer deposited upon a central portion of the free layer but not upon a side portion of the free layer adjacent to each lateral side thereof; and
   a first longitudinal hard biaisng structure laterally adjacent to the first lateral side of the sensor structure and a second longitudinal hard biasing structure laterally adjacent to the second lateral side of the sensor structure, each longitudinal hard biasing structure comprising
      a seed layer deposited upon the substrate, each lateral side of the sensor structure, and each side portion of the free layer, the seed layer having a seed layer crystal structure and being a magnetic material, and
      a magnetic hard bias layer deposited upon the seed layer, the hard bias layer having a hard bias layer crystal structure.

7. The magnetoresistance sensor of claim 6, wherein the side portion of the free layer has a width exceeding about 0.05 micrometers.

8. The magnetoresistance sensor of claim 6, wherein the sensor structure comprises a giant magnetoresistance sensor.

9. The magnetoresistance sensor of claim 6, therein the hard bias layer physically contacts at least a portion of the cap layer.

10. The magnetoresistance sensor of claim 6, wherein the seed layer crystal structure is body centered cubic, and the hard bias layer crystal structure is hexagonal close packed.

11. The magnetoresistance sensor of claim 6, wherein the seed layer is a CoFeCr alloy, and the hard bias layer is a CoPtCr alloy.

* * * * *